US005491702A

United States Patent [19]
Kinsel

[11] Patent Number: 5,491,702
[45] Date of Patent: Feb. 13, 1996

[54] APPARATUS FOR DETECTING ANY SINGLE BIT ERROR, DETECTING ANY TWO BIT ERROR, AND DETECTING ANY THREE OR FOUR BIT ERROR IN A GROUP OF FOUR BITS FOR A 25- OR 64-BIT DATA WORD

[75] Inventor: John R. Kinsel, San Jose, Calif.

[73] Assignee: Silicon Graphics, Inc., Mountain View, Calif.

[21] Appl. No.: 918,819

[22] Filed: Jul. 22, 1992

[51] Int. Cl.⁶ .................................................. H03M 13/00
[52] U.S. Cl. ........................ 371/37.2; 371/37.7; 371/38.1; 371/39.1; 371/49.3
[58] Field of Search ................................... 371/37.1–37.9, 371/38.1, 39.1, 41, 40.2, 49.1, 51.1, 11.3, 13, 65

[56] References Cited

U.S. PATENT DOCUMENTS

| | | | |
|---|---|---|---|
| 3,623,155 | 11/1971 | Hsiao | 340/146.1 |
| 3,755,779 | 8/1973 | Price | 340/146.1 |
| 4,030,067 | 6/1977 | Howell et al. | 371/37.7 |
| 4,139,148 | 2/1979 | Scheuneman et al. | 235/312 |
| 4,201,337 | 5/1980 | Lewis et al. | 371/37 |
| 4,241,446 | 12/1980 | Trubisky | 371/37.1 |
| 4,403,263 | 9/1983 | Kageyama et al. | 360/32 |
| 4,532,629 | 7/1985 | Furuya et al. | 371/38.1 |
| 4,604,748 | 8/1986 | Sato | 371/38 |
| 4,617,664 | 10/1986 | Aichelmann, Jr. et al. | 371/38 |
| 4,631,725 | 12/1986 | Takamura et al. | 371/37 |
| 4,651,321 | 3/1987 | Woffinden et al. | 371/38 |
| 4,736,376 | 4/1988 | Stiffler | 371/37.1 |
| 4,993,028 | 2/1991 | Hillis | 371/39.1 |
| 4,995,041 | 2/1991 | Hetherington et al. | 371/40.1 |
| 5,010,554 | 4/1991 | Bechtel et al. | 371/37.1 |
| 5,051,999 | 9/1991 | Erhart et al. | 371/37.1 |
| 5,381,425 | 1/1995 | Bitzer et al. | 371/43 |

OTHER PUBLICATIONS

Hsiao, M. Y., "A Class of Optimal Minimum Odd-weight-column SEC-DED Codes," *IBM J. Res. Develop.*, Jul. 1970, pp. 395–401.

*Primary Examiner*—Robert W. Beausoliel, Jr.
*Assistant Examiner*—Dieu-Minh Le
*Attorney, Agent, or Firm*—Sterne, Kessler, Goldstein & Fox

[57] ABSTRACT

An error detection system wherein 64 bits of data word are protected by 8 check bits which yield 8-bit syndromes. Single-bit errors are indicated by syndromes that contain exactly three "1"s or by syndromes that contain exactly five "1"s in which bits 0–3 or 4–7 of the syndrome are all "1." Single-bit errors that occur from faulty check bits are indicated by syndromes that contain exactly one "1." All two-bit errors, and four-bit errors within a nibble, are indicated by syndromes that contain an even number of "1"s (i.e., an even number of "1"s). Three-bit errors within a nibble are indicated by syndromes that contain five "1"s in which bits 0–3 of the syndrome and bits 4–7 of the syndrome are not all "1." Four-bit errors within a nibble are indicated by syndromes that contain four "1"s. In another embodiment of the invention, 25 bits of data word are protected by 7 check bits yielding 7-bit syndromes. Single-bit errors are indicated by syndromes that contain exactly three "1"s except single-bit errors that occur from faulty check bits are indicated by syndromes that contain exactly one "1". Two-bit errors are indicated by syndromes that contain an even number of "1"s, and three-bit errors within a nibble are indicated by syndromes that contain five "1"s or seven "1"s. Four-bit errors within a nibble are indicated by syndromes that contain four "1"s or six "1"s.

117 Claims, 6 Drawing Sheets

APPARATUS FOR DETECTING ANY SINGLE BIT ERROR, DETECTING ANY TWO BIT ERROR, AND DETECTING ANY THREE OR FOUR BIT ERROR IN A GROUP OF FOUR BITS FOR A 25- OR 64-BIT DATA WORD

BACKGROUND OF THE INVENTION

This invention relates to fault detection in computer systems and, more particularly, to a method and apparatus for detecting memory failures using error detecting/correcting codes.

Many techniques are known for detecting and/or correcting data errors which occur in computer systems. Such errors typically occur because of hardware failure or because of external influences such as electromagnetic radiation, subatomic particles, etc. The errors ordinarily occur as inverted data bits within the datum. That is, an error appears as a "1" which should be a "0" and vice versa. A common error detection technique includes the use of parity bits embedded within the datum. To determine the value of the parity bit, the number of "1"s in the datum (not including the parity bit) are counted, and it is determined whether the sum is even or odd. In even parity systems, the total number of "1"s in the datum (including the parity bit) must always be even. Thus, if the total number of "1"s in the datum, less the parity bit, is odd, then the parity bit is set to "1", whereas if the total number of "1"s in the datum is even, then the parity bit is set to "0". In odd parity systems, the parity bit is set to ensure that the total number of "1"s in the datum, including the parity bit, is odd. Of course, this simple parity bit scheme cannot detect an even number of errors, so a datum with 2, 4, 6, etc., errors will appear error-free. Furthermore, the location of the erroneous bit is unknown, so the error cannot be corrected.

More advanced systems are available which locate the position of single bit errors and which detect the existence of multiple bit errors. See, for example, R. W. Hamming, "Error Detecting and Error Correcting Codes," *Bell System Tech. J.* 29, 147(1950); W. W. Peterson, Error Correcting Codes, MIT Press, Cambridge, Mass., 1961; and M.Y Hsiao, "A Class of Optimal Minimum Odd-Weight-Column SEC-DED Codes" *IBM J. Res. Develop.*, July 1970, p. 395. In a typical system employing one of these codes, the datum is encoded to produce a first plurality of check bits (e.g., 8 bits) which are appended to the datum. The value of each check bit is determined from a unique subset of bits of the datum in the same manner described for the calculation of parity bits. When the datum is later read, the subsets are combined with their respective check bits to produce a plurality of bits termed a "syndrome." If the syndrome bits are zero, the datum is free of errors. However, if the syndrome bits are non-zero, then an error exists somewhere in the datum. The value of the syndrome bits may be used for locating and correcting single bit errors.

An example of such a system constructed for a 64-bit datum is shown in the Hsiao publication noted above. In this system, referred to as odd-weight-column, single error correcting and double error detecting (SEC-DED) codes, different subsets of the 64 data bits are used to generate 8 check bits. The system can detect single and double bit errors, and the check bits may be used to correct single bit errors. Unfortunately, the system disclosed can mistake three-bit errors as single bit errors, and some four-bit errors go undetected.

When a memory system is constructed using 1-bit-wide memory modules, the most likely errors to occur are single bit errors, since each module contributes only one bit to the datum and therefore to the check bit calculation. This simplifies error correction. However, with the advent of four-bit wide memory modules (e.g., DRAMS), a complete failure of a memory module appears as a 1, 2, 3- or 4-bit error where the bits in error are all in the same four-bit nibble of the datum. Thus, memory system integrity would be greatly improved if there were a way to detect 3- and 4-bit errors within any nibble of the datum, while still detecting all single and double bit errors and correcting single bit errors.

SUMMARY OF THE INVENTION

The present invention is directed to the use of odd-weight-column single error correction, double error detection codes for computer circuits such as memories having data widths of 64 bits or 25 bits. The present invention has the capability of correcting single bit errors and detecting double bit errors, and it also detects three-bit or four-bit errors within a nibble. In one embodiment of the present invention, 64 bits of data are protected by 8 check bits which yield eight-bit syndromes. Single-bit errors are indicated by syndromes that contain exactly three "1"s or by syndromes that contain five "1"s in which bits 0–3 or 4–7 of the syndrome are all "1." Single bit errors that occur from faulty check bits are indicated by syndromes that contain exactly one "1". All two-bit errors, and four-bit errors within a nibble, are indicated by syndromes that contain an even number of "1"s. Three-bit errors within a nibble are indicated by syndromes that contain five "1"s in which bits 0–3 of the syndrome and bits 4–7 of the syndrome are not all "1." Four-bit errors within a nibble are indicated by syndromes that contain four "1"s (i.e., an even number of "1"s). In another embodiment of the present invention, 25 bits of data are protected by 7 check bits yielding seven-bit syndromes. Single-bit errors are indicated by syndromes that contain exactly three "1"s, except single bit errors that occur from faulty check bits are indicated by syndromes that contain exactly one "1". Two-bit errors are indicated by syndromes that contain an even number of "1"s, and three-bit errors within a nibble are indicated by syndromes that contain five "1"s or seven "1"s. Four-bit errors within a nibble are indicated by syndromes that contain four "1"s or six "1"s.

DESCRIPTION OF THE PREFERRED EMBODIMENT

Figure 1:
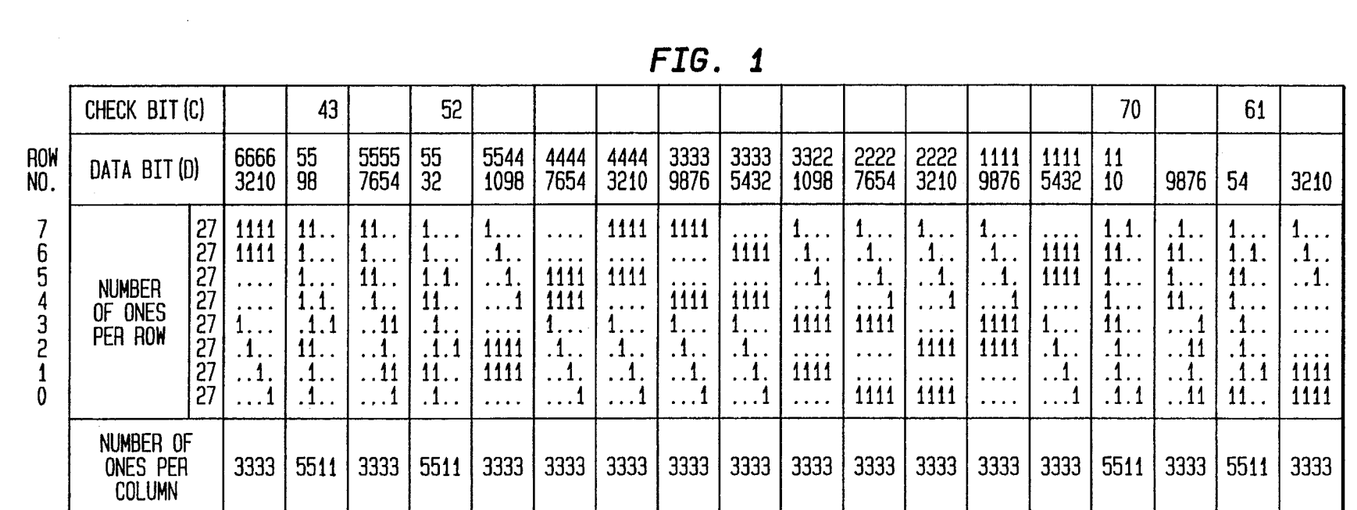
FIG. 1 is a diagram of a particular embodiment of a parity check matrix according to the present invention which may be used for detecting and correcting errors in a group of sixty-four bits.

FIG. 1 is a diagram of a particular embodiment of a parity check matrix according to the present invention which may be used for detecting and correcting errors in a group of sixty-four bits (e.g., data in a cache memory). In this embodiment, the sixty-four data bits are protected by eight check bits for yielding eight-bit syndromes. The 18 sections, each of four columns, represent information stored, for example, as 18 four-bit nibbles in 18 separate DRAMs, each with a "four-by-X" organization where X depends on the density of the DRAM. Of course, in alternative embodiments of the invention other memories or memory organizations can be employed. The positions of the eight check bits are shown in the top row, while the positions of the 64 data bits are shown in the next two rows, where the top row is the first (most significant) digit of the data bit number and the second row is the second (least significant) digit of the data bit number. For example, as shown in the top row check bit C2 appears in the fourth four-bit nibble from the left in the right-most bit position, while data bit D51 appears immediately to the right of check bit C2. Unlike the check bits described in the Hsiao reference discussed above, the check bits are not grouped together and appended to the end of each 64-bit data block. Instead, the check bits are interspersed throughout the 64-bit data block, and not necessarily in numerical order.

Figure 2:
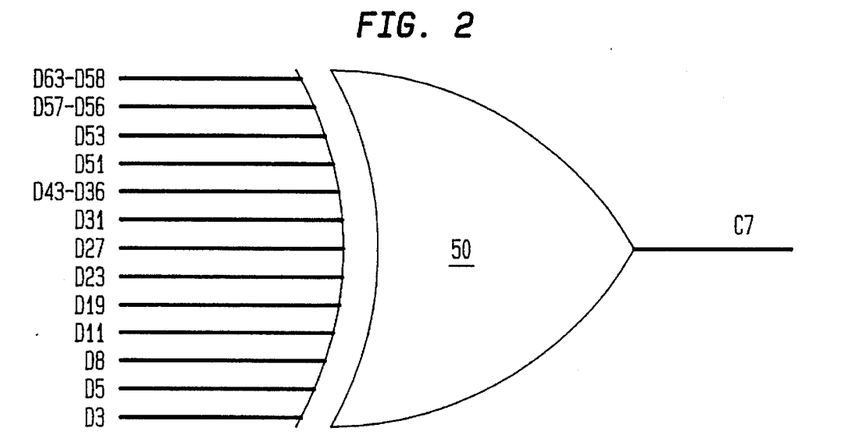
FIG. 2 is a diagram of a particular embodiment of a check bit generating. circuit according to the present invention.
Figure 3:
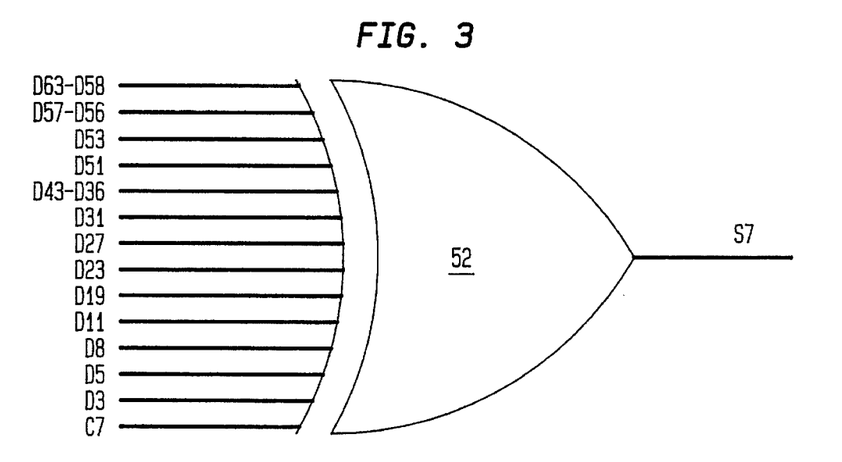
FIG. 3 is a diagram of a particular embodiment of a syndrome bit generating circuit according to the present invention.

As shown in FIG. 1, the matrix includes eight rows, each of which is used to generate one check bit and one syndrome bit. Each "1" in a data bit position indicates that the associated data bit is included in an exclusive-OR which is used to calculate a check bit for that row. For example, FIG. 2 shows how check bit C7 is generated from row 7 of the matrix. Data bits numbered 63–58, 57–56, 53, 51, 43–36, 31, 27, 23, 19, 11, 8, 5 and 3 are input to an exclusive-OR gate 50 whose output terminal provides the value of check bit C7. As shown in FIG. 3, the corresponding syndrome bit S7 is generated by an exclusive-OR gate 52 using the same bits together with check bit C7. The eight syndrome bits, S7 through S0, together comprise the syndrome for the 64-bit code.

The bottom row of the parity check matrix indicates the number of "1"s in each column of the matrix. The check bit columns contain only one "1" since each check bit is used to calculate only one syndrome bit. Most columns contain three "1"s, while some columns contain 5 "1"s. Each column of the parity check matrix is unique. That is, no column has the same pattern of "1"s as another column. This allows detection and correction of single bit errors. For example, if data bit 63 is in error, then the syndrome will have the value 11001000. Since no other column has that pattern, the identification of bit 63 as the bit in error is assured. The syndrome pattern then may be decoded using appropriate gating circuitry to identify and correct the erroneous bit as discussed below in conjunction with FIGS. 6A–D and 7A–B.

The matrix is constructed so that single bit data errors are indicated by syndromes that contain exactly three "1"s or by syndromes that contain 5 "1"s in which bits 0–3 or 4–7 of the syndrome are all "1." If the check bits themselves are in error, then syndromes containing one "1" result. For example, if check bit 4 is in error, then a syndrome of 00010000 results. Two-bit errors are indicated by syndromes that contain an even number of "1"s. For example, if both bits 63 and 62 are in error, then the errors in rows 7 and 6 cancel each other, and only the "1"s, in rows 2 and 3 contribute to the final syndrome pattern of 00001100. Three-bit errors within a nibble are indicated by syndromes that contain 5 "1"s in which bits 0–3 of the syndrome and bits 4–7 of the syndrome are not all "1." For example, if data bits 63–61 are in error, then the syndrome 11001110 results. Four bit errors within a nibble are indicated by syndromes that contain four "1"s (i.e., an even number of "1"s). For example, if bits 63–60 are in error, then the errors in rows 6 and 7 cancel each other, and a syndrome of 00001111 results.

Figure 4:
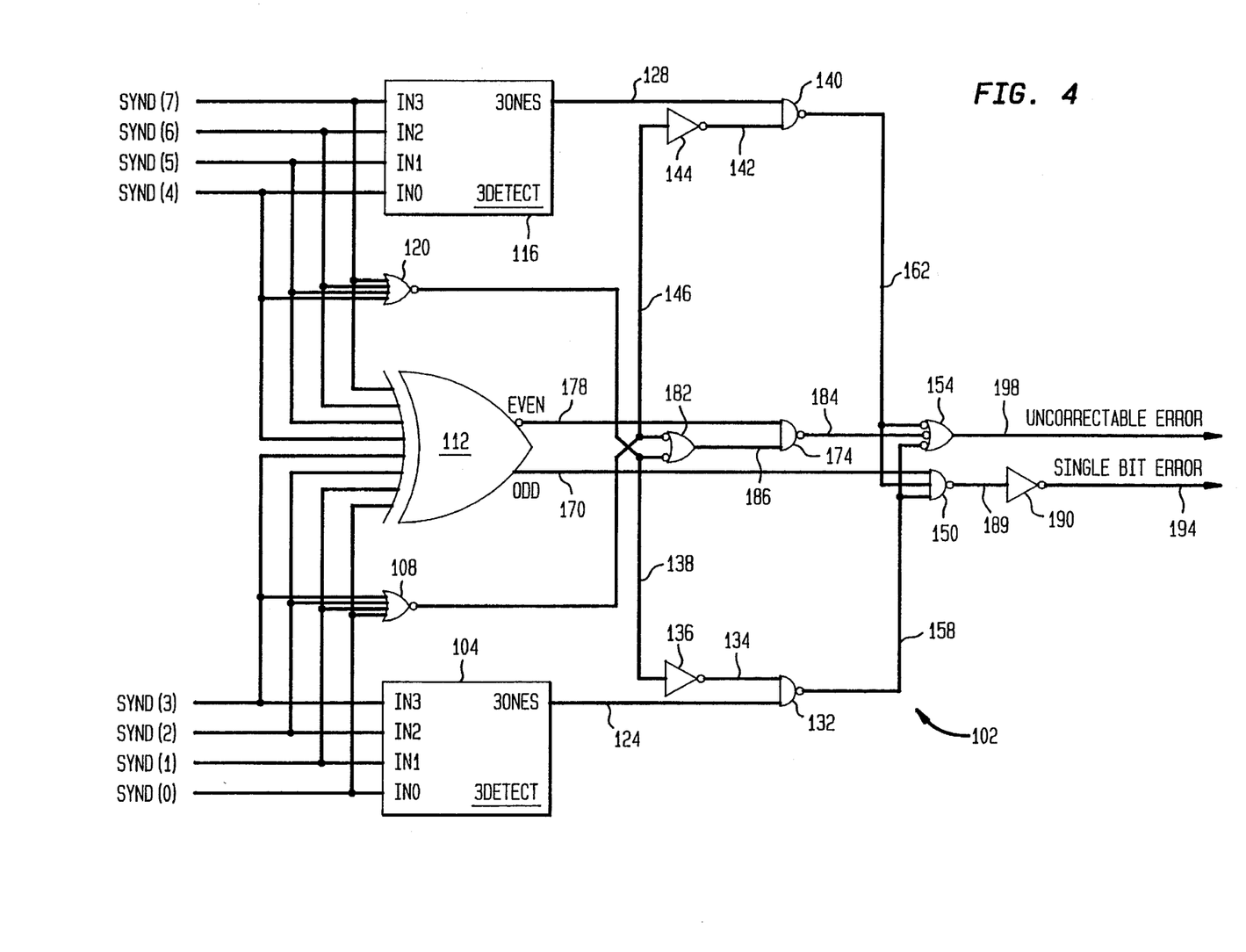
FIG. 4 is a schematic diagram of a particular embodiment of an error detection/classification circuit according to the present invention for use with the parity check matrix shown in FIG. 1.

FIG. 4 is a schematic diagram of a particular embodiment of an error detection/classification circuit 102 according to the present invention. Syndrome bits S0–S3 are communicated to a three-ones detector 104, to a NOR gate 108, and to an exclusive-OR/NOR gate 112. Similarly, syndrome bits S4–S7 are communicated to a three-ones detector 116, to a NOR gate 120, and to exclusive-OR/NOR gate 112. Three-ones detector 104, whose particular circuitry is discussed further below, detects the occurrence of exactly three "1"s in syndrome bits S0–S3, and three-ones detector 116 detects the occurrence of exactly three "1"s in syndrome bits S4–S7. The occurrence of exactly three "1"s in syndrome bits S0–S3 is indicated by a high signal appearing on output line 124 from detector 104, and the occurrence of exactly three-ones in syndrome bits S4–S7 is indicated by a high signal on three-ones output line 128.

Three-ones line 124 is coupled to one input terminal of a NAND gate 132. The other input terminal of NAND gate 132 is coupled through a line 134 to an output terminal of an inverter 136 which, in turn, has an input terminal coupled to the output terminal of NOR gate 120 through a line 138. A high signal on line 134 indicates the occurrence of one or more "1"s in syndrome bits S4–S7. The output terminal of NAND gate 132 is coupled to a line 158. A low signal on line 158 indicates the occurrence of exactly three-ones in syndrome bits S0–S3 and one or more ones in syndrome bits S4–S7. Line 158 is coupled to a first input terminal of a NAND gate 150 and to a first inverted input terminal of an OR gate 154.

Similarly, three-ones line 128 is coupled to one input terminal of a NAND gate 140. The other input terminal of NAND gate 140 is coupled through a line 142 to an output terminal of an inverter 144 which, in turn, has an input terminal coupled to the output terminal of NOR gate 108 through a line 146. A high signal on line 142 indicates the occurrence of one or more "1"s in syndrome bits S0–S3. The output terminal of NAND gate 140 is coupled to a line 162. A low signal on line 162 indicates the occurrence of exactly three "1"s in syndrome bits S4–S7 and one or more "1"s in syndrome bits S0–S3. Line 162 is coupled to a second input terminal of NAND gate 150 and to a second inverted input terminal of OR gate 154.

Exclusive-OR/NOR gate 112 determines whether or not the number of "1"s in the syndrome bits S0–S7 is even or odd. The exclusive-OR output terminal of OR/NOR gate 112 is coupled to a third input terminal of NAND gate 150 through an odd-ones line 170. The exclusive-NOR output terminal of exclusive-OR/NOR gate 112 is coupled to one input terminal of a NAND gate 174 through a line 178. The other input terminal of NAND gate 174 is coupled to the output terminal of an OR gate 182 through a line 186. The output terminal of NAND gate 174 is coupled to a line 184 which, in turn, is coupled to a third inverted input terminal of OR gate 154. OR gate 182 has two inverted input terminals. One inverted input terminal is coupled to line 138, and the other inverted input terminal is coupled to line 146. Thus, the signal on line 186 indicates whether the syndrome contains at least one "1."This ensures that a low signal on even error line 184 does not occur when the syndrome bits are all zero (which indicates error-free data).

The output terminal of NAND gate 150 is coupled through a line 189 to an input terminal of an inverter 190 which, in turn, has an output terminal coupled to a single-bit error line 194. A review of the inputs to NAND gate 150 reveals that a high signal appears on single-bit error line 194 whenever a single bit correctable error occurs. That is, whenever the syndrome contains exactly one "1," when the syndrome contains exactly three "1"s, or when the syndrome contains five "1"s and syndrome bits S0–S3 or S4–S7 are all "1"s. To understand why this is so, it should be noted that a high signal on odd-ones line 170 indicates the syndrome contains one, three, five, or seven ones. A one-bit error is assured when the syndrome contains one "1" or three "1"s. On the other hand, a syndrome which contains five "1"s may indicate a one-bit error, while a syndrome which contains seven "1"s does not indicate a one-bit error. To indicate a one-bit error, the five-ones syndrome must have syndrome bits S0–S3 or S4–S7 all "1"s. Clearly a syndrome which contains more than three bits when three of them are in either bits S0–S3 or S4–S7 cannot satisfy the five-bit syndrome, one-bit error case (although it could satisfy the three-bit error case), so a low signal on either line 158 or line 162 inhibits the generation of the single bit error signal in that case. A low signal on either line 158 or line 162 also will be generated when the syndrome contains exactly seven bits, thus inhibiting the generation of the one-bit error signal in that case.

The output terminal of OR gate 154 is coupled to an uncorrectable-error line 198. A review of the inputs to OR gate 154 reveals that a high signal appears on uncorrectable-error line 198 whenever any two bits are in error or when three or four bits within a nibble are in error (uncorrectable errors) That is, when the syndrome contains an even number of ones, when the syndrome contains five ones and syndrome bits S0–S3 or S4–S7 are not all ones, or when the syndrome contains seven ones. To understand why this is so, it should be noted that a low signal on line 184 indicates the syndrome contains an even number of ones, and a low signal on either line 158 or line 162 indicates the other two cases.

Figure 5:
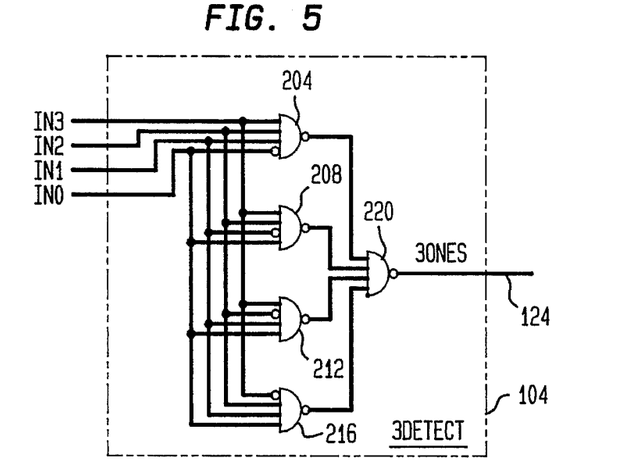
FIG. 5 is a schematic diagram of a particular embodiment of the three-ones detection circuitry shown in FIG. 4.

FIG. 5 is a schematic diagram of a particular embodiment of three-ones detector 104. Both three-ones detector 116 and three-ones detector 104 are constructed the same way. Bits 0–3 of the syndrome are communicated to respective input terminals of NAND gates 204, 208, 212 and 216. It should be noted that one input terminal of each NAND gate 204–216 is an inverted input terminal. Thus, each NAND gate is adapted to detect one of the patterns "1110,""1101," ""1011,"or "0111,"respectively. The output terminal of each NAND gate 204–216 is coupled to a corresponding input terminal of a NAND gate 220. The output terminal of NAND gate 220 is coupled to three-ones line 124. Thus, if any of the patterns of three ones is present on input terminals In0 to In3, then a high signal is provided on output line 124.

Figure 6A:
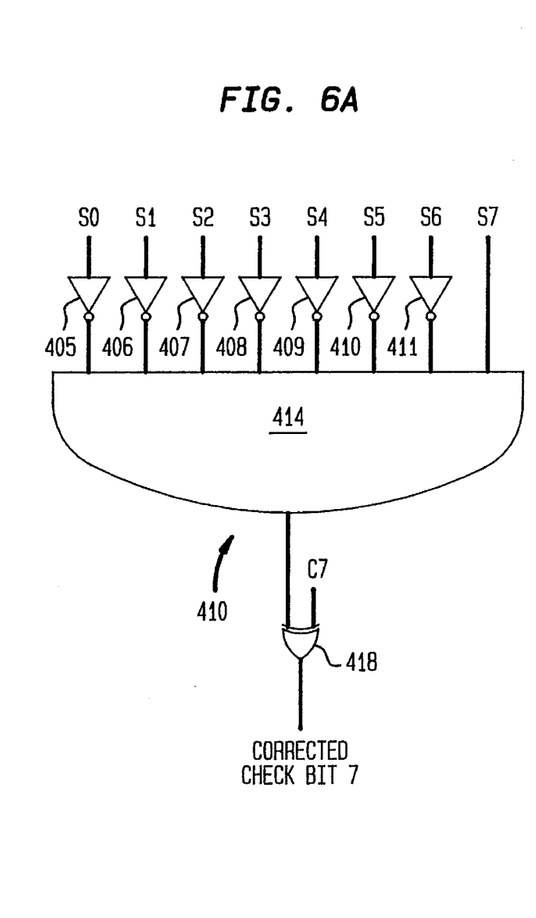
FIGS. 6A–D are schematic diagrams of particular embodiments of error correction circuits according to the present invention for use with the circuit shown in FIG. 4.

FIGS. 6A–D are schematic diagrams of particular embodiments of error correction circuits according to the present invention for use in conjunction with error detection/ classification circuit 102. FIG. 6A is a schematic diagram of typical check bit correction logic using check bit C7 as an example. Syndrome bits S0–S6 are coupled to input terminals of respective inverters 405–411. The output terminals of inverters 405–411 are coupled to respective input terminals of an AND gate 414. Syndrome bit S7 is coupled directly to another input terminal of AND gate 414. The output terminal of AND gate 414 is coupled to an input terminal of an exclusive-OR gate 418. The other input terminal of exclusive-OR gate is coupled for receiving the (erroneous) check bit C7. As shown if FIG. 1, when check bit C7 is in error syndrome bits S0–S6 are "0" and syndrome bit S7 is a "1". Consequently, a "1" is provided at the output terminal of AND gate 414 which causes exclusive-OR gate 418 to function as an inverter. The erroneous check bit C7 is thus inverted to its correct value.

Figure 6B:
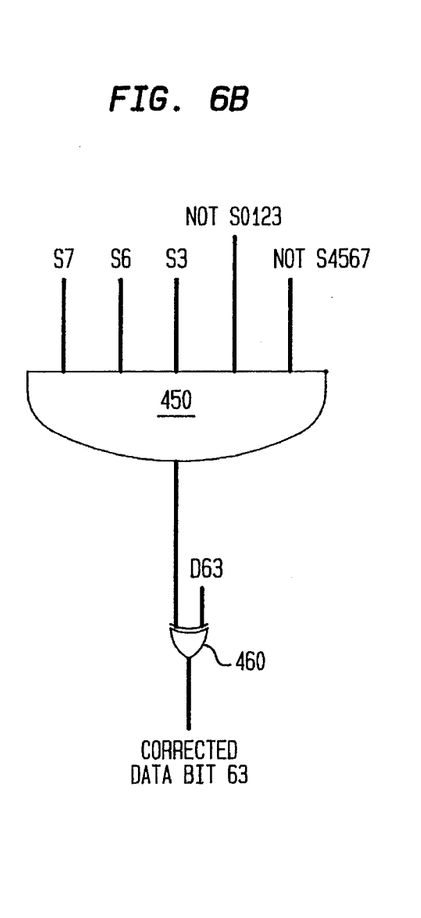

FIG. 6B is a schematic diagram of data bit correction logic for data bits 63 . . . 60, 57 . . . 54, 51 . . . 12, 9 . . . 6, and 3 . . . 0, using data bit D63 as an example. Syndrome bits S7, S6, and S3 are coupled to respective input terminals of an AND gate 450. NOTS0123 and NOTS4567 signals are also coupled to respective input terminals of AND gate 450. The NOTS0123 and NOTS4567 signals are generated by the logic shown in FIGS. 7A–B. That is, the NOTS0123 signal is generated by coupling syndrome bits S0–S3 to respective input terminals of a NAND gate 454 so that a low signal appears at the output terminal of NAND gate 458 whenever syndrome bits S0–S3 are all "1". Similarly, the NOTS4567 signal is generated by coupling syndrome bits S4–S7 to respective input terminals of a NAND gate 458 so that a low signal appears at the output terminal of NAND gate 458 whenever syndrome bits S4–S7 are all "1".

The output terminal of AND gate 450 is coupled to an input terminal of an exclusive-OR gate 460. The other input terminal of exclusive-OR gate 460 is coupled for receiving data bit D63. When syndrome bits S7, S6, and S3 are each "1" and when neither syndrome bits S0–S3 nor syndrome bits S4–S7 are all "1"s, then a high signal is provided at the output terminal of AND gate 450 which causes exclusive-OR gate 460 to function as an inverter. The erroneous data bit D63 is thus inverted to its correct value.

Figure 6C:
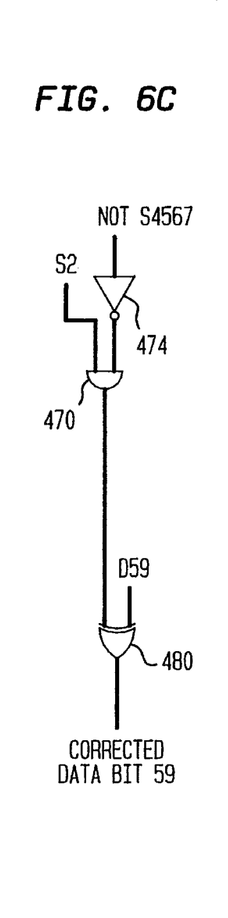

FIG. 6C is a schematic diagram of data bit correction logic for data bits 59, 53, 11, and 5, using data bit D59 as an example. Syndrome bit S2 is coupled to an input terminal of an AND gate 450. The other input terminal of AND gate 470 is coupled to an output terminal of an inverter 474 which, in turn, has an input terminal coupled for receiving the NOTS4567 signal. The output terminal of AND gate 470 is coupled to an input terminal of an exclusive-OR gate 480. The other input terminal of exclusive-OR gate 480 is coupled for receiving data bit D59. When syndrome bit S2 is a "1," and when syndrome bits S4–S7 are all "1"s, then a high signal is provided at the output terminal of AND gate 470 which causes exclusive-OR gate 480 to function as an inverter. The erroneous data bit D59 is thus inverted to its correct value.

Figure 6D:
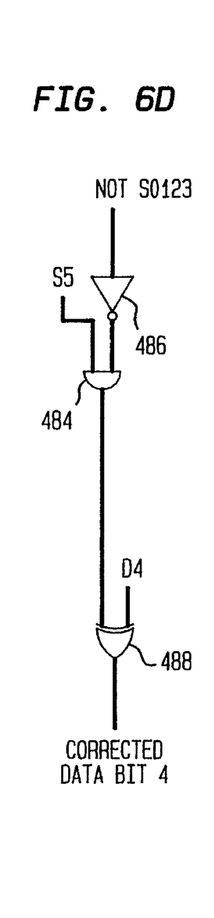
Figure 7A:
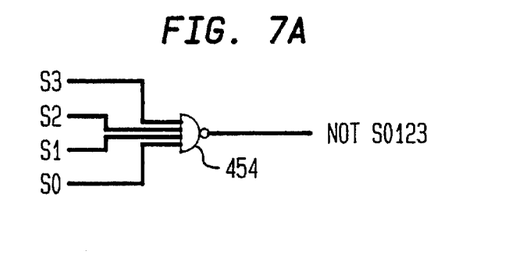
FIGS. 7A–B are schematic diagrams of particular embodiments of syndrome predecode circuits according to the present invention for use with the circuitry shown in FIGS. 6B–D.
Figure 7B:
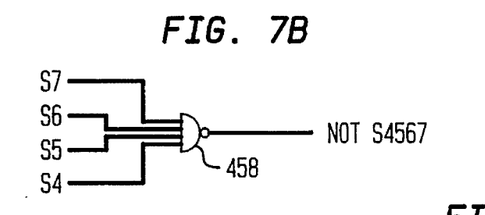

FIG. 6D is a schematic diagram of data bit correction logic for data bits 58, 52, 10, and 4, using data bit D4 as an example. Syndrome bit S5 is coupled to an input terminal of an AND gate 484. The other input terminal of AND gate 484 is coupled to an output terminal of an inverter 486 which, in turn, has an input terminal coupled for receiving the NOTS0123 signal. The output terminal of AND gate 484 is coupled to an input terminal of an exclusive-OR gate 488. The other input terminal of exclusive-OR gate 488 is coupled for receiving data bit D4. When syndrome bit S5 is a "1," and when syndrome bits S0–S3 are all "1"s, then a high signal is provided at the output terminal of AND gate 484 which causes exclusive-OR gate 488 to function as an inverter. The erroneous data bit D4 is thus inverted to its correct value.

Figure 8:
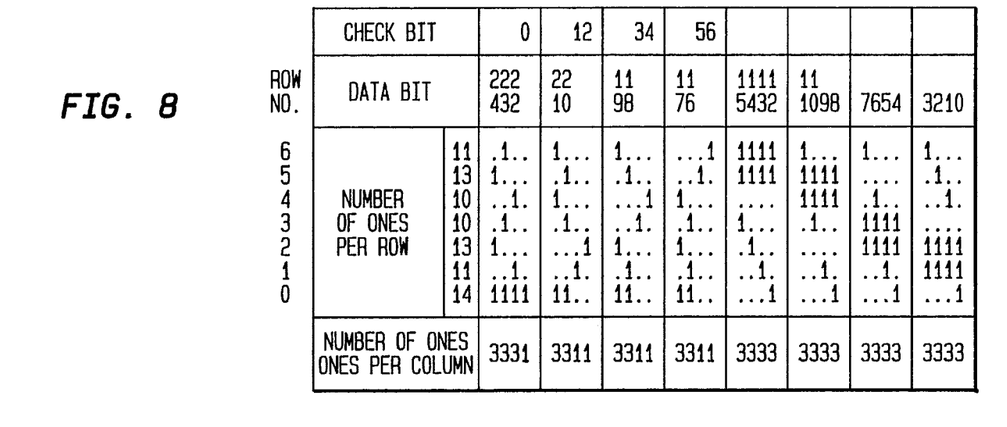
FIG. 8 is a diagram of a particular embodiment of a parity check matrix according to the present invention which may be used for detecting and correcting errors in a group of twenty-five bits.

FIG. 8 is a diagram of a particular embodiment of a parity check matrix according to the present invention which may be used for detecting and correcting errors in a group of twenty-five bits (e.g., tag data in a cache memory). In this embodiment, the 25 tag data bits numbered 0 to 24 are protected by 7 check bits numbered 0 to 6 yielding seven bit syndromes. The organization of FIG. 6 is like that of FIG. 1 with four-bit nibbles represented by groups of columns, and with the bits used for calculating the check and syndrome bits indicated by the rows 0 to 6. Check bit errors are indicated by syndromes that contain one "1," while other single bit errors are indicated by syndromes that contain exactly three "1"s. Two-bit errors are indicated by syndromes that contain an even number of "1"s. Three-bit errors within a nibble are indicated by syndromes that contain five or seven "1"s, and four-bit errors within a nibble are indicated by syndromes that contain 4 or 6 "1"s.

Figure 9:
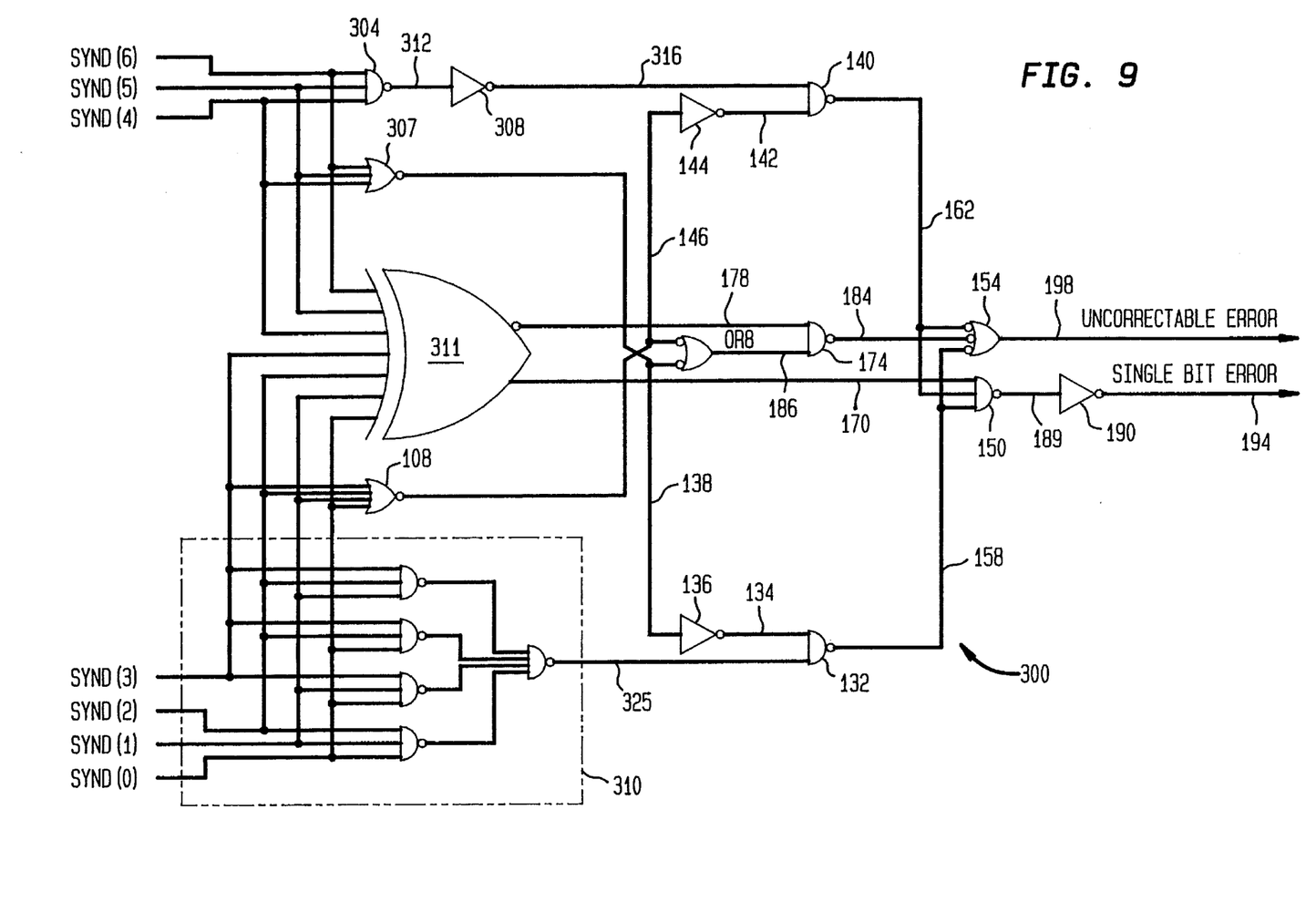
FIG. 9 is a schematic diagram showing a particular embodiment of an error detection/classification circuit according to the present invention for use with the parity check matrix shown in FIG. 8.

FIG. 9 is a schematic diagram of an alternative embodiment of an error detection/classification circuit 300 according to the present invention which may be used with the parity check matrix shown in FIG. 8. The circuit is very similar to the circuit shown in FIG. 4, and those circuit elements which remain the same retain their original numbering. As shown in FIG. 9, syndrome bits S4–S6 are coupled to the input terminals of a NAND gate 304. The output terminal of NAND gate 304 is coupled to the input terminal of an inverter 308 through a line 312. The output terminal of inverter 308 is coupled to an input terminal of NAND gate 140 through a line 316. A high signal on line 316 indicates that syndrome bits S4–S6 are all "1"s, and a low signal on line 162 indicates the syndrome contains four or more ones. NOR gate 307 and exclusive-OR/NOR gate 311 are the same as in FIG. 4 except that NOR gate 307 has only three input terminals, and exclusive-OR/NOR gate 311 has only seven input terminals. Syndrome bits S0–S3 are coupled to a three-or-four-ones detector 310 which is constructed as shown. A high signal on line 325 indicates the syndrome contains at least three "1"s, and a low signal on line 158 indicates the syndrome contains four or more ones. A review of the inputs to NAND gate 150 reveals that a high signal appears on single-bit error line whenever the syndrome contains one or three "1"s. A review of the inputs to OR gate 154 reveals that a high signal appears on uncorrectable error line whenever the syndrome contains an even number of "1"s or four or more "1"s.

Figure 10A:
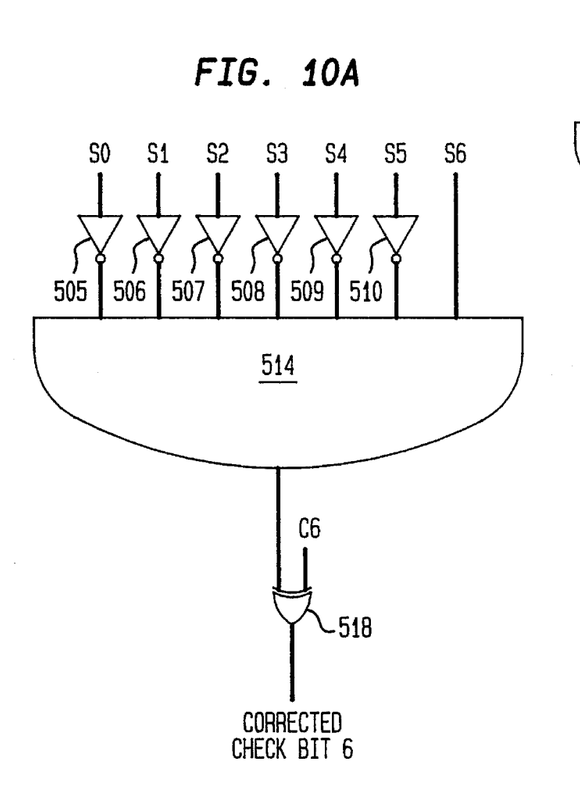
FIGS. 10A–B are schematic diagrams showing particular embodiments of error correction circuits according to the present invention for use with the circuit shown in FIG. 9.
Figure 10B:
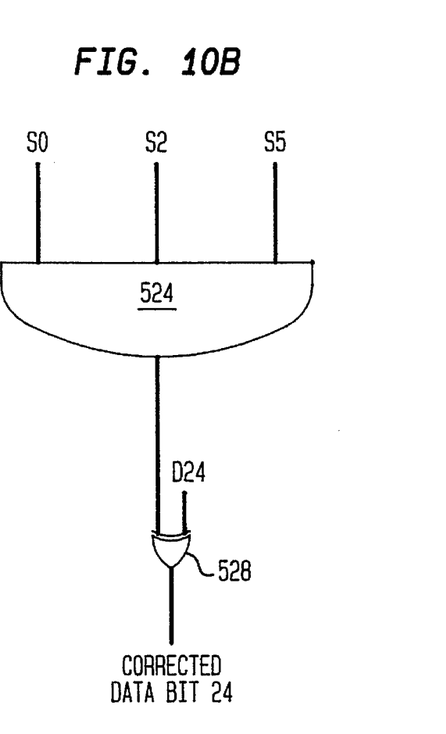

FIGS. 10A–B are schematic diagrams of particular embodiments of error correction circuits according to the present invention for use in conjunction with error detection/classification circuit 300. FIG. 10A is a schematic diagram of typical check bit correction logic using check bit C6 as an example. Syndrome bits S0–S5 are coupled to the input terminals of respective inverters 505–510. The output terminals of inverters 505–510 are coupled to respective input terminals of an AND gate 514. Syndrome bit S6 is coupled directly to another input terminal of AND gate 514. The output terminal of AND gate 514 is coupled to an input terminal of an exclusive-OR gate 518. The other input terminal of exclusive-OR gate 518 is coupled for receiving the (erroneous) check bit C6. As noted in FIG. 8, when check bit C6 is in error syndrome bits S0–S5 are "0" and syndrome bit S6 is a "1". Consequently, a "1" is provided at the output terminal of AND gate 514 which causes exclusive-OR gate 518 to function as an inverter. The erroneous check bit C6 is thus inverted to its correct value.

FIG. 10B is a schematic diagram of data bit correction logic for any data bit, using data bit D24 as an example. Syndrome bits S0, S2, and S5 are coupled to an input terminal of an AND gate 524. The output terminal of AND gate 524 is coupled to an input terminal of an exclusive-OR gate 528. The other input terminal of exclusive-OR gate 528 is coupled for receiving data bit D24. When syndrome bits S0, S2, and S5 are "1"s (per the parity check matrix), a high signal appears at the output terminal of AND gate 524 which causes exclusive-OR gate 528 to function as an inverter. The erroneous data bit D24 is thus inverted to its correct value.

While the above is a complete description of a preferred embodiment of the present invention, various modifications may be employed. Consequently, the full scope of the invention should be ascertained by the appended claims.

What is claimed is:

1. An apparatus for detecting data errors in a block of data comprising:

syndrome calculating means for calculating a multiple-bit syndrome from the block of data; and three-bit-error indicating means, coupled to the syndrome calculating means, for indicating every occurrence of a three-bit error within a four-bit group of data bits within the block of data and distinguishing all three-bit errors from one-bit errors, wherein the three-bit-error indicating means comprises:

more-than-three-ones detecting means, coupled to the syndrome calculating means, for detecting the occurrence of more than three ones in the syndrome; and error signalling means, coupled to the more-than-three-ones detecting means, for providing an error signal when the syndrome contains more than three ones.

2. The apparatus according to claim 1 further comprising one-bit-error indicating means, coupled to the syndrome calculating means, for indicating every occurrence of only one-bit errors within the block of data.

3. The apparatus according to claim 1 wherein the syndrome comprises eight bits including a first four-bit portion and a second four-bit portion, and wherein the more-than-three-ones detecting means comprises three-ones detecting means, coupled to the syndrome calculating means, for detecting the occurrence of exactly three ones in the first four-bit portion of the syndrome.

4. The apparatus according to claim 3 wherein the more-than-three-ones detecting means further comprises ones detecting means, coupled to the syndrome calculating means, for detecting the occurrence of at least one one in the second four-bit portion of the syndrome.

5. The apparatus according to claim 1 wherein the syndrome comprises seven bits including a four-bit portion and a three-bit portion, and wherein the more-than-three-ones detecting means comprises three-or-more-ones detecting means, coupled to the syndrome calculating means, for detecting the occurrence of three or more ones in the four-bit portion of the syndrome.

6. The apparatus according to claim 5 wherein the more-than-three-ones detecting means further comprises ones detecting means, coupled to the syndrome calculating means, for detecting the occurrence of at least one one in the three-bit portion of the syndrome.

7. The apparatus according to claim 5 wherein the more-than-three-ones detecting means comprises three-ones detecting means, coupled to the syndrome calculating means, for detecting the occurrence of three ones in the three-bit portion of the syndrome.

8. The apparatus according to claim 7 wherein the more-than-three-ones detecting means further comprises ones detecting means, coupled to the syndrome calculating means, for detecting the occurrence of at least one one in the four-bit portion of the syndrome.

9. The apparatus according to claim 1 wherein the syndrome comprises eight bits including a first four-bit portion and a second four-bit portion, and wherein the three-bit-error indicating means indicates the occurrence of a three-bit error when the syndrome contains exactly five ones and neither the first four-bit portion nor the second four-bit portion contain four ones.

10. The apparatus according to claim 9 wherein the three-bit-error indicating means comprises:
more-than-three-ones detecting means, coupled to the syndrome calculating means, for detecting the occurrence of more than three ones in the syndrome; and
error signalling means, coupled to the more-than-three-ones detecting means, for providing an error signal when the syndrome contains more than three ones.

11. The apparatus according to claim 10 wherein the more-than-three-ones detecting means comprises first three-ones detecting means, coupled to the syndrome calculating means, for detecting the occurrence of exactly three ones in the first four-bit portion of the syndrome.

12. The apparatus according to claim 11 wherein the more-than-three-ones detecting means further comprises first three-ones detecting means, coupled to the syndrome calculating means, for detecting the occurrence of at least one one in the second four-bit portion of the syndrome.

13. The apparatus according to claim 12 wherein the more-than-three-ones detecting means further comprises:
second three-ones detecting means, coupled to the syndrome calculating means, for detecting the occurrence of exactly three ones in the second four-bit portion of the syndrome; and
second ones detecting means, coupled to the syndrome calculating means, for detecting the occurrence of at least one one in the first four-bit portion of the syndrome.

14. The apparatus according to claim 1 wherein the syndrome comprises seven bits including a four-bit portion and a three-bit portion, and wherein the three-bit-error indicating means indicates the occurrence of a three-bit error when the syndrome contains exactly five ones.

15. The apparatus according to claim 14 wherein the three-bit-error indicating means comprises:
more-than-three-ones detecting means, coupled to the syndrome calculating means, for detecting the occurrence of more than three ones in the syndrome; and
error signalling means, coupled to the more-than-three-ones detecting means, for providing an error signal when the syndrome contains more than three ones.

16. The apparatus according to claim 15 wherein the more-than-three-ones detecting means comprises three-or-more-ones detecting means, coupled to the syndrome calculating means, for detecting the occurrence of three or more ones in the four-bit portion of the syndrome.

17. The apparatus according to claim 16 wherein the more-than-three-ones detecting means further comprises ones detecting means, coupled to the syndrome calculating means, for detecting the occurrence of at least one one in the three-bit portion of the syndrome.

18. The apparatus according to claim 15 wherein the more-than-three-ones detecting means comprises three-ones detecting means, coupled to the syndrome calculating means, for detecting the occurrence of three ones in the three-bit portion of the syndrome.

19. The apparatus according to claim 18 wherein the more-than-three-ones detecting means further comprises ones detecting means, coupled to the syndrome calculating means, for detecting the occurrence of at least one one in the four-bit portion of the syndrome.

20. The apparatus according to claim 19 wherein the more-than-three-ones detecting means comprises three-or-more-ones detecting means, coupled to the syndrome calculating means, for detecting the occurrence of three or more ones in the four-bit portion of the syndrome.

21. The apparatus according to claim 20 wherein the more-than-three-ones detecting means further comprises ones detecting means, coupled to the syndrome calculating means, for detecting the occurrence of at least one one in the three-bit portion of the syndrome.

22. The apparatus according to claim 21 wherein the three-bit-error indicating means indicates the occurrence of a three-bit error when the syndrome contains exactly seven ones.

23. The apparatus according to claim 1 wherein the block of data comprises a plurality of check bits interspersed throughout the block of data and not grouped together and appended to the block of data.

24. An apparatus for detecting data errors in a block of data comprising:
syndrome calculating means for calculating a multiple-bit syndrome from the block of data; and
four-bit-error indicating means, coupled to the syndrome calculating means, for indicating every occurrence of a four-bit error within a four bit group of data bits within the block of data, the four bit error indicating means comprising:
even-ones detecting means, coupled to the syndrome calculating means, for detecting the occurrence of an even number of ones in the syndrome; and
error signalling means, coupled to the even-ones detecting means, for providing an error signal when the syndrome contains an even number of ones.

25. The apparatus according to claim 24 further comprising one-bit-error indicating means, coupled to the syndrome calculating means, for indicating every occurrence of only one-bit errors within the block of data.

26. The apparatus according to claim 25 wherein the syndrome contains exactly eight bits.

27. The apparatus according to claim 25 wherein the syndrome contains exactly seven bits.

28. The apparatus according to claim 27 wherein the four-bit-error indicating means indicates the occurrence of a four-bit error when the syndrome contains exactly six ones.

29. The apparatus according to claim 24 wherein the four-bit-error indicating means indicates the occurrence of a four-bit error when the syndrome contains exactly four ones.

30. The apparatus according to claim 24 wherein the block of data comprises a plurality of check bits interspersed throughout the block of data and not grouped together and appended to the block of data.

31. An apparatus for detecting data errors in a block of data comprising:

syndrome calculating means for calculating a multiple bit syndrome from the block of data;

three-bit error indicating means, coupled to the syndrome calculating means, for indicating every occurrence of a three-bit error within any four bit group of data bits within the block of data and distinguishing all three-bit errors from one-bit errors; and four-bit-error indicating means, coupled to the syndrome calculating means, for indicating every occurrence of a four-bit error within any four-bit group or data bits within the block of data, wherein the four-bit-error indicating means comprises:

even-ones detecting means, coupled to the syndrome calculating means, for detecting the occurrence of an even number of ones in the syndrome; and error signalling means, coupled to the even-ones detecting means, for providing an error signal when the syndrome contains an even number of ones.

32. The apparatus according to claim 31 wherein the four-bit-error indicating means indicates the occurrence of a four-bit error when the syndrome contains exactly four ones.

33. The apparatus according to claim 31 wherein the syndrome comprises eight bits including a first four-bit portion and a second four-bit portion, and wherein the three-bit-error indicating means indicates the occurrence of a three-bit error when the syndrome contains exactly five ones and neither the first four-bit portion nor the second four-bit portion contain four ones.

34. The apparatus according to claim 33 wherein the three-bit-error indicating means comprises:

more-than-three-ones detecting means, coupled to the syndrome calculating means, for detecting the occurrence of more than three ones in the syndrome; and error signalling means, coupled to the more-than-three-ones detecting means, for providing an error signal when the syndrome contains more than three ones.

35. The apparatus according to claim 34 wherein the more-than-three-ones detecting means comprises three-ones detecting means, coupled to the syndrome calculating means, for detecting the occurence of exactly three ones in the first four-bit portion of the syndrome.

36. The apparatus according to claim 35 wherein the more-than-three-ones detecting means further comprises ones detecting means, coupled to the syndrome calculating means, for detecting the occurrence of at least one one in the second four-bit portion of the syndrome.

37. The apparatus according to claim 36 further comprising one-bit-error indicating means, coupled to the syndrome calculating means, for indicating every occurrence of one-bit errors within the block of data.

38. The apparatus according to claim 37 wherein the one-bit-error indicating means provides an error signal when the syndrome contains exactly one one.

39. The apparatus according to claim 37 wherein the one-bit-error indicating means provides an error signal when the syndrome contains exactly three ones.

40. The apparatus according to claim 37 wherein the one-bit-error indicating means provides an error signal when the syndrome contains exactly five ones and either the first four-bit portion or the second four-bit portion contains four ones.

41. The apparatus according to claim 37 wherein the one-bit-error indicating means provides an error signal when the syndrome contains exactly one one, when the syndrome contains exactly three ones, and when the syndrome contains exactly five ones and either the first four-bit portion or the second four-bit portion contains four ones.

42. The apparatus according to claim 31 wherein the syndrome comprises seven bits including a four-bit portion and a three-bit portion, and wherein the three-bit-error indicating means indicates the occurrence of a three-bit error when the syndrome contains exactly five ones.

43. The apparatus according to claim 42 wherein the three-bit-error indicating means comprises:

more-than-three-ones detecting means, coupled to the syndrome calculating means, for detecting the occurrence of more than three ones in the syndrome; and error signalling means, coupled to the more-than-three-ones detecting means, for providing an error signal when the syndrome contains more than three ones.

44. The apparatus according to claim 43 wherein the more-than-three-ones detecting means comprises three-or-more-ones detecting means, coupled to the syndrome calculating means, for detecting the occurrence of three or more ones in the four-bit portion of the syndrome.

45. The apparatus according to claim 44 wherein the more-than-three-ones detecting means further comprises ones detecting means, coupled to the syndrome calculating means, for detecting the occurrence of at least one one in the three-bit portion of the syndrome.

46. The apparatus according to claim 43 wherein the more-than-three-ones detecting means comprises three-ones detecting means, coupled to the syndrome calculating means, for detecting the occurrence of three ones in the three-bit portion of the syndrome.

47. The apparatus according to claim 46 wherein the more-than-three-ones detecting means further comprises ones detecting means, coupled to the syndrome calculating means, for detecting the occurrence of at least one one in the four-bit portion of the syndrome.

48. The apparatus according to claim 47 wherein the more-than-three-ones detecting means comprises three-or-more-ones detecting means, coupled to the syndrome calculating means, for detecting the occurrence of three or more ones in the four-bit portion of the syndrome.

49. The apparatus according to claim 48 wherein the more-than-three-ones detecting means further comprises ones detecting means, coupled to the syndrome calculating means, for detecting the occurrence of at least one one in the three-bit portion of the syndrome.

50. The apparatus according to claim 49 wherein the three-bit-error indicating means indicates the occurrence of a three-bit error when the syndrome contains exactly seven ones.

51. The apparatus according to claim 31 wherein the block of data comprises a plurality of check bits interspersed throughout the block of data and not grouped together and appended to the block of data.

52. An apparatus for detecting data errors in a sixty-four bit block of data comprising:

syndrome calculating means for calculating an eight bit syndrome from the block of data, the syndrome including a first four-bit portion and a second four-bit portion;

a first three-ones detecting means, coupled to the syndrome calculating means, for detecting an occurrence of exactly three ones in the first four-bit portion of the syndrome;

a second three-ones detecting means, coupled to the syndrome calculating means, for detecting an occurrence of exactly three ones in the second four-bit portion of the syndrome;

a first ones detecting means, coupled to the syndrome calculating means, for detecting an occurrence of one or more ones in the first four bit portion of the syndrome;

a second ones detecting means, coupled to the syndrome calculating means, for detecting an occurrence of one or more ones in the second four-bit portion of the syndrome;

even ones detecting means, coupled to the syndrome calculating means, for detecting an occurrence of an even number of ones in the syndrome;

odd ones detecting means, coupled to the syndrome calculating means, for detecting an occurrence of an odd number of ones in the syndrome;

one-bit-error indicating means, coupled to the first three ones detecting means, to the second three ones detecting means, to the first ones detecting means, to the second ones detecting means, and to the odd ones detecting means, for providing a one-bit-error signal indicating an occurrence of one-bit errors within the block of data; and uncorrectable error indicating means, coupled to the first three-ones detecting means, to the second three-ones detecting means, to the first ones detecting means, to the second ones detecting means, and to the even ones detecting means, for providing an uncorrectable-error signal indicating every occurrence of two-bit errors and three-bit and four-bit errors within a four-bit group of data bits within the block of data and distinguishing all three-bit errors from one-bit errors.

53. The apparatus according to claim 52 wherein the uncorrectable error indicating means provides the uncorrectable-error signal when the syndrome contains an even number of ones and when the syndrome contains exactly five ones and neither the first four-bit portion nor the second four-bit portion contain four ones.

54. The apparatus according to claim 52 wherein the one-bit-error indicating means provides the one-bit-error signal when the syndrome contains exactly one one, when the syndrome contains exactly three ones, and when the syndrome contains exactly five ones and either the first four-bit portion or the second four-bit portion contains four ones.

55. The apparatus according to claim 52 wherein the block of data comprises a plurality of check bits interspersed throughout the block of data and not grouped together and appended to the block of data.

56. An apparatus for detecting data errors in a twenty-five bit block of data comprising:

syndrome calculating means for calculating a seven-bit syndrome from the block of data, the syndrome including a four-bit portion and a three-bit portion;

three-ones detecting means, coupled to the syndrome calculating means, for detecting an occurrence of three ones in the three-bit portion of the syndrome;

first ones detecting means, coupled to the syndrome calculating means, for detecting an occurrence of at least one one in the four-bit portion of the syndrome;

three-or-more-ones detecting means, coupled to the syndrome calculating means, for detecting an occurrence of three or more ones in the four-bit portion of the syndrome;

second ones detecting means, coupled to the syndrome calculating means, for detecting an occurrence of at least one one in the three-bit portion of the syndrome;

even ones detecting means, coupled to the syndrome calculating means, for detecting an occurrence of an even number of ones in the syndrome;

odd ones detecting means, coupled to the syndrome calculating means, for detecting an occurrence of an odd number of ones in the syndrome;

one-bit-error indicating means, coupled to the three ones detecting means, to the first ones detecting means, to the three-or-more-ones detecting means, to the second ones detecting means, and to the odd ones detecting means, for providing a one-bit-error signal indicating an occurrence of one-bit errors within the block of data; and uncorrectable error indicating means, coupled to the three-ones detecting means, to the first ones detecting means, to the three-or-more-ones detecting means, to the second ones detecting means, and to the even ones detecting means, for providing an uncorrectable-error signal indicating every occurrence of two-bit errors and three-bit and four-bit errors within a four-bit group of data bits within the block of data and distinguishing all three bit errors from one-bit errors.

57. The apparatus according to claim 56 wherein the uncorrectable error indicating means provides the uncorrectable-error signal when the syndrome contains an even number of ones and when the syndrome contains an odd number of ones greater than three.

58. The apparatus according to claim 57 wherein the uncorrectable error indicating means provides the uncorrectable-error signal when the syndrome contains exactly five ones and exactly seven ones.

59. The apparatus according to claim 56 wherein the one-bit-error indicating means provides the one-bit-error signal when the syndrome contains an odd number of ones less than five.

60. The apparatus according to claim 59 wherein the one-bit-error indicating means provides the one-bit-error signal when the syndrome contains exactly one one and exactly three ones.

61. The apparatus according to claim 56 wherein the block of data comprises a plurality of check bits interspersed throughout the block of data and not grouped together and appended to the block of data.

62. An apparatus for detecting data errors in a block of data having a plurality of check bits interspersed throughout the block of data comprising:

syndrome calculating circuitry for calculating a multiple-bit syndrome from the block of data; and three-bit-error indicating circuitry, coupled to the syndrome calculating circuitry, for indicating every occurrence of a three-bit error within a four-bit group of data bits within the block of data and distinguishing all three-bit errors from one-bit errors, wherein the three-bit-error indicating circuitry comprises:

more-than-three-ones detecting circuitry, coupled to the syndrome calculating circuitry, for detecting the occurrence of more than three ones in the syndrome; and error signalling circuitry, coupled to the more-than-three-ones detecting circuitry, for providing an error signal when the syndrome contains more than three ones.

63. The apparatus according to claim 62 further comprising one-bit-error indicating circuitry, coupled to the syndrome calculating circuitry, for indicating every occurrence of only one-bit errors within the block of data.

64. The apparatus according to claim 63 wherein the syndrome comprises eight bits including a first four-bit portion and a second four-bit portion, and wherein the more-than-three-ones detecting circuitry comprises three-ones detecting circuitry, coupled to the syndrome calculating circuitry, for detecting the occurrence of exactly three ones in the first four-bit portion of the syndrome.

65. The apparatus according to claim 64 wherein the more-than-three-ones detecting circuitry further comprises ones detecting circuitry, coupled to the syndrome calculating circuitry, for detecting the occurrence of at least one one in the second four-bit portion of the syndrome.

66. The apparatus according to claim 62 wherein the syndrome comprises seven bits including a four-bit portion and a three-bit portion, and wherein the more-than-three-ones detecting circuitry comprises three-or-more-ones detecting circuitry, coupled to the syndrome calculating circuitry, for detecting the occurrence of three or more ones in the four-bit portion of the syndrome.

67. The apparatus according to claim 60 wherein the more-than-three-ones detecting circuitry further comprises ones detecting circuitry, coupled to the syndrome calculating circuitry, for detecting the occurrence of at least one one in the three-bit portion of the syndrome.

68. The apparatus according to claim 60 wherein the more-than-three-ones detecting circuitry comprises three-ones detecting circuitry, coupled to the syndrome calculating circuitry, for detecting the occurrence of three ones in the three-bit portion of the syndrome.

69. The apparatus according to claim 68 wherein the more-than-three-ones detecting circuitry further comprises ones detecting circuitry, coupled to the syndrome calculating circuitry, for detecting the occurrence of at least one one in the four-bit portion of the syndrome.

70. The apparatus according to claim 69 wherein the syndrome comprises eight bits including a first four-bit portion and a second four-bit portion, and wherein the three-bit-error indicating circuitry indicates the occurrence of a three-bit error when the syndrome contains exactly five ones and neither the first four-bit portion nor the second four-bit portion contain four ones.

71. The apparatus according to claim 70 wherein the three-bit-error indicating circuitry comprises:

more-than-three-ones detecting circuitry, coupled to the syndrome calculating circuitry, for detecting the occurrence of more than three ones in the syndrome; and error signalling circuitry, coupled to the more-than-three-ones detecting circuitry, for providing an error signal when the syndrome contains more than three ones.

72. The apparatus according to claim 71 wherein the more-than-three-ones detecting circuitry comprises first three-ones detecting circuitry, coupled to the syndrome calculating circuitry, for detecting the occurrence of exactly three ones in the first four-bit portion of the syndrome.

73. The apparatus according to claim 72 wherein the more-than-three-ones detecting circuitry further comprises first ones detecting circuitry, coupled to the syndrome calculating circuitry, for detecting the occurrence of at least one one in the second four-bit portion of the syndrome.

74. The apparatus according to claim 73 wherein the more-than-three-ones detecting circuitry further comprises:

second three-ones detecting circuitry, coupled to the syndrome calculating circuitry, for detecting the occurrence of exactly three ones in the second four-bit portion of the syndrome; and second ones detecting circuitry, coupled to the syndrome calculating circuitry, for detecting the occurrence of at least one one in the first four-bit portion of the syndrome.

75. The apparatus according to claim 69 wherein the syndrome comprises seven bits including a four-bit portion and a three-bit portion, and wherein the three-bit-error indicating circuitry indicates the occurrence of a three-bit error when the syndrome contains exactly five ones.

76. The apparatus according to claim 75 wherein the three-bit-error indicating circuitry comprises:

more-than-three-ones detecting circuitry, coupled to the syndrome calculating circuitry, for detecting the occurrence of more than three ones in the syndrome; and error signalling circuitry, coupled to the more-than-three-ones detecting circuitry, for providing an error signal when the syndrome contains more than three ones.

77. The apparatus according to claim 72 wherein the more-than-three-ones detecting circuitry comprises three-or-more-ones detecting circuitry, coupled to the syndrome calculating circuitry, for detecting the occurrence of three or more ones in the four-bit portion of the syndrome.

78. The apparatus according to claim 77 wherein the more-than-three-ones detecting circuitry further comprises ones detecting circuitry, coupled to the syndrome calculating circuitry, for detecting the occurrence of at least one one in the three-bit portion of the syndrome.

79. The apparatus according to claim 76 wherein the more-than-three-ones detecting circuitry comprises three-ones detecting circuitry, coupled to the syndrome calculating circuitry, for detecting the occurrence of three ones in the three-bit portion of the syndrome.

80. The apparatus according to claim 79 wherein the more-than-three-ones detecting circuitry further comprises ones detecting circuitry, coupled to the syndrome calculating circuitry, for detecting the occurrence of at least one one in the four-bit portion of the syndrome.

81. The apparatus according to claim 80 wherein the more-than-three-ones detecting circuitry comprises three-or-more-ones detecting circuitry, coupled to the syndrome calculating circuitry, for detecting the occurrence of three or more ones in the four-bit portion of the syndrome.

82. The apparatus according to claim 81 wherein the more-than-three-ones detecting circuitry further comprises ones detecting circuitry, coupled to the syndrome calculating circuitry, for detecting the occurrence of at least one one in the three-bit portion of the syndrome.

83. The apparatus according to claim 82 wherein the three-bit-error indicating circuitry indicates the occurrence of a three-bit error when the syndrome contains exactly seven ones.

84. An apparatus for detecting data errors in a block of data having a plurality of check bits interspersed throughout the block of data comprising:

syndrome calculating circuitry for calculating a multiple-bit syndrome from the block of data; and four-bit-error indicating circuitry, coupled to the syndrome calculating circuitry, for indicating every occurrence of a four-bit error within a four bit group of data bits within the block of data, the four bit error indicating circuitry comprising:

even-ones detecting circuitry, coupled to the syndrome calculating circitry, for detecting the occurrence of an even number of ones in the syndrome; and error signalling circuitry, coupled to the even-ones detecting circuitry, for providing an error signal when the syndrome contains an even number of ones.

85. The apparatus according to claim 84 further comprising one-bit-error indicating circuitry, coupled to the syndrome calculating circuitry, for indicating every occurrence of only one-bit errors within the block of data.

86. The apparatus according to claim 84 wherein the four-bit-error indicating circuitry indicates the occurrence of a four-bit error when the syndrome contains exactly four ones.

87. The apparatus according to claim 85 wherein the syndrome contains exactly eight bits.

88. The apparatus according to claim 85 wherein the syndrome contains exactly seven bits.

89. The apparatus according to claim 88 wherein the four-bit-error indicating circuitry indicates the occurrence of a four-bit error when the syndrome contains exactly six ones.

90. An apparatus for detecting data errors in a block of data having a plurality of check bits interspersed throughout the block of data comprising:

syndrome calculating circuitry for calculating a multiple bit syndrome from the block of data;

three-bit error indicating circuitry, coupled to the syndrome calculating circuitry, for indicating every occurrence of a three-bit error within any four bit group of data bits within the block of data and distinquishing all three-bit errors from one-bit errors; and four-bit-error indicating circuitry, coupled to the syndrome calculating circuitry, for indicating every occurrence of a four-bit error within any four-bit group of data bits within the block of data, wherein the four-bit-error indicating circuitry comprises:

even-ones detecting circuitry, coupled to the syndrome calculating circuitry, for detecting the occurrence of an even number of ones in the syndrome; and error signalling circuitry, coupled to the even-ones detecting circuitry, for providing an error signal when the syndrome contains an even number of ones.

91. The apparatus according to claim 90 wherein the four-bit-error indicating circuitry indicates the occurrence of a four-bit error when the syndrome contains exactly four ones.

92. The apparatus according to claim 90 wherein the syndrome comprises eight bits including a first four-bit portion and a second four-bit portion, and wherein the three-bit-error indicating circuitry indicates the occurrence of a three-bit error when the syndrome contains exactly five ones and neither the first four-bit portion nor the second four-bit portion contain four ones.

93. The apparatus according to claim 92 wherein the three-bit-error indicating circuitry comprises:

more-than-three-ones detecting circuitry, coupled to the syndrome calculating circuitry, for detecting the occurrence of more than three ones in the syndrome; and error signalling circuitry, coupled to the more-than-three-ones detecting circuitry, for providing an error signal when the syndrome contains more than three ones.

94. The apparatus according to claim 93 wherein the more-than-three-ones detecting circuitry comprises three-ones detecting circuitry, coupled to the syndrome calculating circuitry, for detecting the occurrence of exactly three ones in the first four-bit portion of the syndrome.

95. The apparatus according to claim 94 wherein the more-than-three-ones detecting circuitry further comprises ones detecting circuitry, coupled to the syndrome calculating circuitry, for detecting the occurrence of at least one one in the second four-bit portion of the syndrome.

96. The apparatus according to claim 95 further comprising one-bit-error indicating circuitry, coupled to the syndrome calculating circuitry, for indicating every occurrence of one-bit errors within the block of data.

97. The apparatus according to claim 96 wherein the one-bit-error indicating circuitry provides an error signal when the syndrome contains exactly one one.

98. The apparatus according to claim 96 wherein the one-bit-error indicating circuitry provides an error signal when the syndrome contains exactly three ones.

99. The apparatus according to claim 96 wherein the one-bit-error indicating circuitry provides an error signal when the syndrome contains exactly five ones and either the first four-bit portion or the second four-bit portion contains four ones.

100. The apparatus according to claim 96 wherein the one-bit-error indicating circuitry provides an error signal when the syndrome contains exactly one one, when the syndrome contains exactly three ones, and when the syndrome contains exactly five ones and either the first four-bit portion or the second four-bit portion contains four ones.

101. The apparatus according to claim 90 wherein the syndrome comprises seven bits including a four-bit portion and a three-bit portion, and wherein the three-bit-error indicating circuitry indicates the occurrence of a three-bit error when the syndrome contains exactly five ones.

102. The apparatus according to claim 101 wherein the three-bit-error indicating circuitry comprises:

more-than-three-ones detecting circuitry, coupled to the syndrome calculating circuitry, for detecting the occurrence of more than three ones in the syndrome; and error signalling circuitry, coupled to the more-than-three-ones detecting circuitry, for providing an error signal when the syndrome contains more than three ones.

103. The apparatus according to claim 102 wherein the more-than-three-ones detecting circuitry comprises three-or-more-ones detecting circuitry, coupled to the syndrome calculating circuitry, for detecting the occurrence of three or more ones in the four-bit portion of the syndrome.

104. The apparatus according to claim 103 wherein the more-than-three-ones detecting circuitry further comprises ones detecting circuitry, coupled to the syndrome calculating circuitry, for detecting the occurrence of at least one one in the three-bit portion of the syndrome.

105. The apparatus according to claim 102 wherein the more-than-three-ones detecting circuitry comprises three-ones detecting circuitry, coupled to the syndrome calculating circuitry, for detecting the occurrence of three ones in the three-bit portion of the syndrome.

106. The apparatus according to claim 105 wherein the more-than-three-ones detecting circuitry further comprises ones detecting circuitry, coupled to the syndrome calculating circuitry, for detecting the occurrence of at least one one in the four-bit portion of the syndrome.

107. The apparatus according to claim 106 wherein the more-than-three-ones detecting circuitry comprises three-or-more-ones detecting circuitry, coupled to the syndrome calculating circuitry, for detecting the occurrence of three or more ones in the four-bit portion of the syndrome.

108. The apparatus according to claim 107 wherein the more-than-three-ones detecting circuitry further comprises ones detecting circuitry, coupled to the syndrome calculating circuitry, for detecting the occurrence of at least one one in the three-bit portion of the syndrome.

109. The apparatus according to claim 108 wherein the three-bit-error indicating circuitry indicates the occurrence of a three-bit error when the syndrome contains exactly seven ones.

110. An apparatus for detecting data errors in a sixty-four bit block of data having a plurality of check bits interspersed throughout the block of data comprising:

syndrome calculating circuitry for calculating an eight bit syndrome from the block of data, the syndrome including a first four-bit portion and a second four-bit portion;

a first three-ones detecting circuitry, coupled to the syndrome calculating circuitry, for detecting an occurrence of exactly three ones in the first four-bit portion of the syndrome;

a second three-ones detecting circuitry, coupled to the syndrome calculating circuitry, for detecting an occurrence of exactly three ones in the second four-bit portion of the syndrome;

a first ones detecting circuitry, coupled to the syndrome calculating circuitry, for detecting an occurrence of one or more ones in the first four bit portion of the syndrome;

a second ones detecting circuitry, coupled to the syndrome calculating circuitry, for detecting an occurrence of one or more ones in the second four-bit portion of the syndrome;

even ones detecting circuitry, coupled to the syndrome calculating circuitry, for detecting an occurrence of an even number of ones in the syndrome;

odd ones detecting circuitry, coupled to the syndrome calculating circuitry, for detecting an occurrence of an odd number of ones in the syndrome;

one-bit-error indicating circuitry, coupled to the first three ones detecting circuitry, to the second three ones detecting circuitry, to the first ones detecting circuitry, to the second ones detecting circuitry, and to the odd ones detecting circuitry, for providing a one-bit-error signal indicating an occurrence of one-bit errors within the block of data; and uncorrectable error indicating circuitry, coupled to the first three-ones detecting circuitry, to the second three-ones detecting circuitry, to the first ones detecting circuitry, to the second ones detecting circuitry, and to the even ones detecting circuitry, for providing an uncorrectable-error signal indicating every occurrence of two-bit errors and three-bit and four-bit errors within a four-bit group of data bits within the block of data and distinguishing all three-bit errors from one-bit errors.

111. The apparatus according to claim 110 wherein the uncorrectable error indicating circuitry provides the uncorrectable-error signal when the syndrome contains an even number of ones and when the syndrome contains exactly five ones and neither the first four-bit portion nor the second four-bit portion contain four ones.

112. The apparatus according to claim 110 wherein the one-bit-error indicating circuitry provides the one-bit-error signal when the syndrome contains exactly one one, when the syndrome contains exactly three ones, and when the syndrome contains exactly five ones and either the first four-bit portion or the second four-bit portion contains four ones.

113. An apparatus for detecting data errors in a twenty-five bit block of data having a plurality of check bits interspersed throughout the block of data comprising:

syndrome calculating circuitry for calculating a seven-bit syndrome from the block of data, the syndrome including a four-bit portion and a three-bit portion;

three-ones detecting circuitry, coupled to the syndrome calculating circuitry, for detecting an occurrence of three ones in the three-bit portion of the syndrome;

first ones detecting circuitry, coupled to the syndrome calculating circuitry, for detecting an occurrence of at least one one in the four-bit portion of the syndrome;

three-or-more-ones detecting circuitry, coupled to the syndrome calculating circuitry, for detecting an occurrence of three or more ones in the four-bit portion of the syndrome;

second ones detecting circuitry, coupled to the syndrome calculating circuitry, for detecting an occurrence of at least one one in the three-bit portion of the syndrome;

even ones detecting circuitry, coupled to the syndrome calculating circuitry, for detecting an occurrence of an even number of ones in the syndrome;

odd ones detecting circuitry, coupled to the syndrome calculating circuitry, for detecting an occurrence of an odd number of ones in the syndrome;

one-bit-error indicating circuitry, coupled to the three ones detecting circuitry, to the first ones detecting circuitry, to the three-or-more-ones detecting circuitry, to the second ones detecting circuitry, and to the odd ones detecting circuitry, for providing a one-bit-error signal indicating an occurrence of one-bit errors within the block of data; and uncorrectable error indicating circuitry, coupled to the three-ones detecting circuitry, to the first ones detecting circuitry, to the three-or-more-ones detecting circuitry, to the second ones detecting circuitry, and to the even ones detecting circuitry, for providing an uncorrectable-error signal indicating every occurrence of two-bit errors and three-bit and four-bit errors within a four-bit group of data bits within the block of data and distinguishing all three bit errors from one-bit errors.

114. The apparatus according to claim 113 wherein the uncorrectable error indicating circuitry provides the uncorrectable-error signal when the syndrome contains an even number of ones and when the syndrome contains an odd number of ones greater than three.

115. The apparatus according to claim 114 wherein the uncorrectable error indicating circuitry provides the uncorrectable-error signal when the syndrome contains exactly five ones and exactly seven ones.

116. The apparatus according to claim 113 wherein the one-bit-error indicating circuitry provides the one-bit-error signal when the syndrome contains an odd number of ones less than five.

117. The apparatus according to claim 116 wherein the one-bit-error indicating circuitry provides the one-bit-error signal when the syndrome contains exactly one one and exactly three ones.

* * * * *